United States Patent

Kuo et al.

[11] Patent Number: 6,067,254
[45] Date of Patent: May 23, 2000

[54] METHOD TO AVOID PROGRAM DISTURB AND ALLOW SHRINKING THE CELL SIZE IN SPLIT GATE FLASH MEMORY

[75] Inventors: Di-Son Kuo, Hsinchu; Yai-Fen Lin, Non-Tour; Chia-Ta Hsieh, Tainan; Hung-Cheng Sung, Hsin-Chu; Jack Yeh, Chue-Pei, all of Taiwan

[73] Assignee: Taiwan Semiconductor Manufacturing Company, Hsin-Chu, Taiwan

[21] Appl. No.: 09/314,590

[22] Filed: May 19, 1999

[51] Int. Cl.[7] ............................... G11C 16/04
[52] U.S. Cl. .................. 365/185.28; 365/185.14; 365/185.15
[58] Field of Search ............... 365/185.14, 185.15, 365/185.18, 185.28, 185.29

[56] References Cited

U.S. PATENT DOCUMENTS

| | | | |
|---|---|---|---|
| 5,067,108 | 11/1991 | Jeng | 365/185 |
| 5,408,429 | 4/1995 | Sawada | 365/185 |
| 5,416,738 | 5/1995 | Shrivastava | 365/185 |
| 5,579,259 | 11/1996 | Samachisa et al. | 365/185.14 |
| 5,579,261 | 11/1996 | Radjg et al. | 365/185.33 |
| 5,600,592 | 2/1997 | Atsumi et al. | 365/185.18 |
| 5,614,747 | 3/1997 | Ahn et al. | 257/316 |
| 5,667,757 | 9/1997 | Jeng | 365/185.1 |
| 5,966,332 | 10/1999 | Takano | 365/185.29 |

Primary Examiner—Son Mai
Attorney, Agent, or Firm—George O. Saile; Stephen B. Ackerman; Larry J. Prescott

[57] ABSTRACT

A method of programming split gate flash memory cells which avoids erroneously programming non selected cells and allows the cell size and the array size to be shrunk below previously realizable limits. For N channel cells with the control gates connected to word lines and drains connected to bit lines a negative voltage is supplied between the non selected word lines and ground potential. For P channel cells with the control gates connected to word lines and drains connected to bit lines a positive voltage is supplied between the non selected word lines and ground potential. This allows the minimum length of the control gate over the channel region to be reduced below previously allowable limits and still prevent programming of non selected cells. This also allows cell size and array size to be reduced.

12 Claims, 3 Drawing Sheets

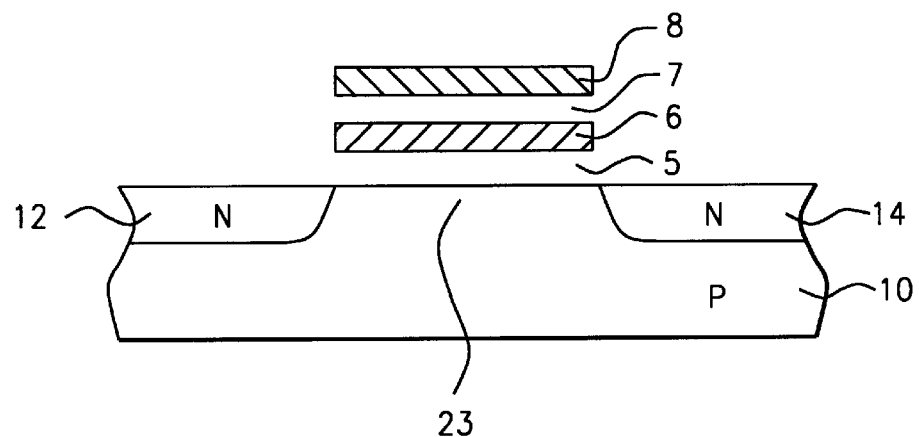
FIG. 1 – Prior Art
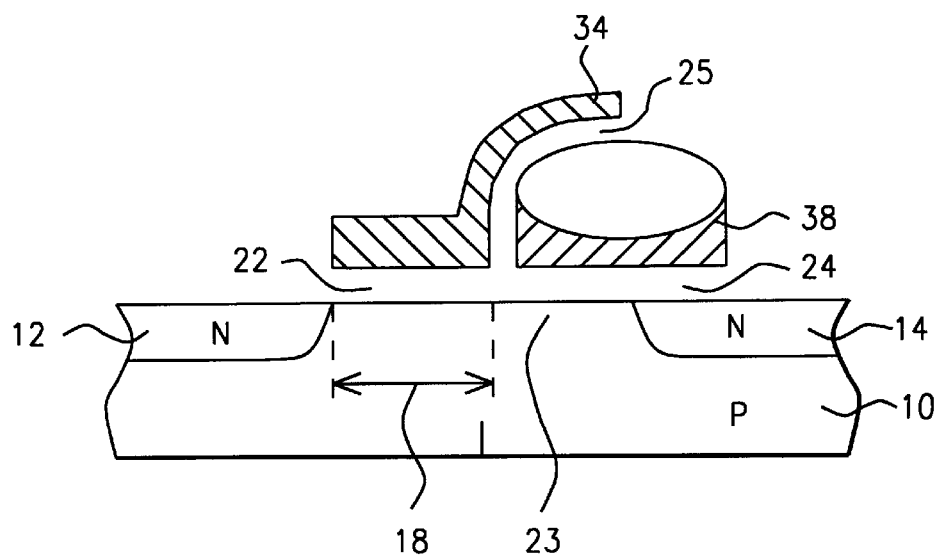
FIG. 2

2

METHOD TO AVOID PROGRAM DISTURB AND ALLOW SHRINKING THE CELL SIZE IN SPLIT GATE FLASH MEMORY

BACKGROUND OF THE INVENTION

1. Field of the Invention

This invention relates to the programming of memory cells in an array of split gate flash memory cells, and more particularly to avoiding program disturb during the programming cycle thereby allowing smaller cell sizes.

2. Description of the Related Art

Electrically alterable read only memory cells, or EEPROM memory cells, which can be electronically programmed and erased find frequent use in memory arrays. Flash memories having either a split gate or a stacked gate structure are often used for this purpose. During the programming cycle of these memory arrays it is important that cells which are not selected for the programming cycle are not disturbed by the programming of the selected cell. Avoiding this program disturb problem can place dimensional requirements on the design of the individual memory cells.

U.S. patent application Ser. No. 09/298,142 (TSMC-98-258), filed on Apr. 23, 1999, entitled "SOURCE SIDE INJECTION PROGRAMMING AND TIP ERASING P-CHANNEL SPLIT GATE FLASH MEMORY CELL", and assigned to the same Assignee describes a method of forming a P channel split gate flash memory cell.

U.S. Pat. No. 5,067,108 to Jenq describes a split gate flash memory cell using hot electron injection into the floating gate to program the cell and Fowler-Nordheim tunneling of electrons from the floating gate to the control gate to erase the cell.

U.S. Pat. No. 5,579,261 to Radjy et al. describes a method of programming a cell in an array of stacked gate flash memory cells in order to reduce leakage current during programming. The invention of Radjy et al. describes only stacked gate cells and not split gate cells.

U.S. Pat. No. 5,600,592 to Astumi et al. describes a flash memory EEPROM device having a word line with a negative voltage applied. A stacked gate flash memory cell is used in the memory. The invention of Astumi describes only stacked gate cells and not split gate cells.

U.S. Pat. No. 5,408,429 to Sawada describes a method for writing data to a selected EEPROM memory cell and erasing data in a selected EEPROM memory cell. The invention of Sawada describes only stacked gate flash memory cells.

U.S. Pat. No. 5,416,738 to Shrivastava describes a single transistor flash memory cell. The invention of Shrivastava describes only stacked gate flash memory cells.

SUMMARY OF THE INVENTION

Examples of flash memory cells are shown in FIGS. 1 and 2. FIG. 1 shows an example of a stacked gate flash memory cell. The stacked gate flash memory cell comprises a source 14 and a drain 12 formed in a silicon substrate 10 defining a channel region 23 between the source 14 and drain 12. A floating gate 6 is formed directly over the channel region 23, covering the entire channel region 23. A control gate 8 is formed directly over the floating gate 6. Oxide or other dielectric, not shown, is formed in the space 5 between the floating gate 6 and the channel 23, and in the space 7 between the floating gate 6 and the control gate 8. FIG. 1 shows an N channel device having source and drain of N type silicon and a substrate of P type silicon. The device can also be a P channel device having source and drain of P type silicon and a substrate of N type silicon.

The split gate flash memory cell, shown in FIG. 2, comprises a source 14 and a drain 12 formed in a silicon substrate 10, thereby defining a channel region 23 between the source 14 and drain 12. A floating gate 38 covers only a part of the channel region 23 and overlaps a part of the source 14. A control gate 34 covers a part of the channel region 23 not covered by the floating gate 38 and extends over an edge of the floating gate 38. Oxide or other dielectric, not shown, fills the space 24 between the floating gate 38 and the substrate 10, the space 22 between the control gate 34 and the substrate 10, and the space 25 between the control gate 34 and the floating gate 38.

In the split gate flash memory cell the current in the channel region is controlled by the electrical potential of both the floating gate 38 and the control gate 34. FIG. 2 shows an N channel device having source and drain of N type silicon and a substrate of P type silicon. The device can also be a P channel device having source and drain of P type silicon and a substrate of N type silicon.

Typically the sources of all the cells in the memory are connected to a common source node. A selected N channel split gate cell is programmed by supplying a high positive voltage to the common source node, about 9.5 volts, a lower positive voltage to the control gate 34, about 2.0 volts, and a still lower positive voltage, about 1.0 volts to the drain 12. These voltages will result in hot electron tunneling from the floating gate 38 into the source 14, thereby charging the floating gate and programming the memory cell. Non selected N channel cells which are also connected so as to have the lower positive voltage, about 1.0 volts, to their drains 12 must be prevented from being programmed. This is conventionally accomplished by grounding the control gates 34 of those cells.

A selected P channel split gate cell is programmed by supplying a high negative voltage to the common source node, about −9.5 volts, a lower negative voltage to the control gate 34, about −2.0 volts, and a still lower negative voltage, about −1.0 volts, to the drain 12. These voltages will result in hot electron tunneling from the source 14 into the floating gate 38, thereby charging the floating gate and programming the memory cell. Non selected P channel cells which are also connected so as to have the lower negative voltage, about −1.0 volts, to their drains 12 must be prevented from being programmed. This is conventionally accomplished by grounding the control gates 34 of those cells.

Two problems result from this method of programming flash memory cells. One problem is program disturb which is the partial charging of the floating gate of non selected cells. Another problem is that in order to control the problem of program disturb the length 18 of that part of the control gate directly over the channel region 23, see FIG. 2, can not be reduced below a minimum length. This minimum length limits the ability to reduce the size of the flash memory cell.

It is a primary objective of this invention to provide a method of programming both N channel and P channel flash memory cells to avoid the problem of program disturb and allow the length of that part of the control gate directly over the channel region to be reduced.

This objective is achieved by supplying a negative voltage between the control gates of non selected N channel cells and ground potential. These non selected N channel cells have a high positive voltage supplied between the common source node and ground potential, and a lower positive voltage supplied between their drains and ground potential.

This objective is also achieved by supplying a positive voltage to the control gates of non selected P channel cells and ground potential. These non selected P channel cells have a high negative voltage supplied between the common source node and ground potential, and a lower negative voltage supplied between their drains and ground potential.

BRIEF DESCRIPTION OF THE DRAWINGS

FIG. 1 shows a cross section view of a stacked gate flash memory cell.

FIG. 2 shows a cross section view of a split gate flash memory cell.

DESCRIPTION OF THE PREFERRED EMBODIMENTS

Figure 3:
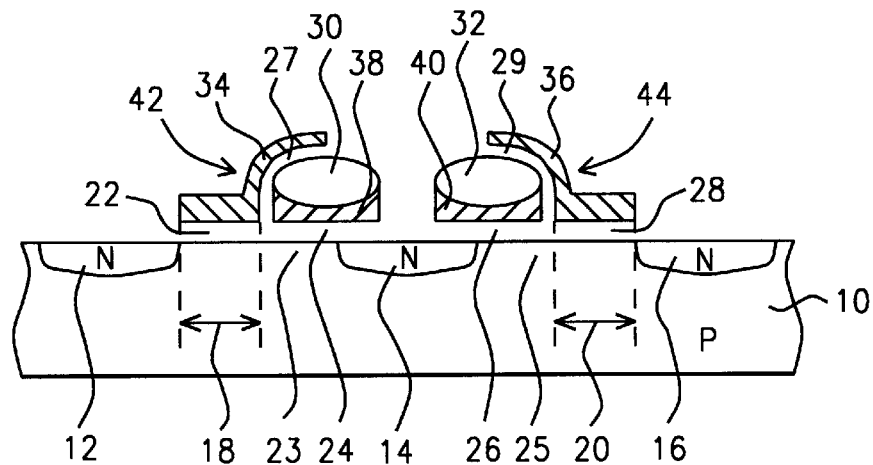
FIG. 3 shows a cross section view of two split gate flash memory cells in an array of split gate flash memory cells.
Figure 4:
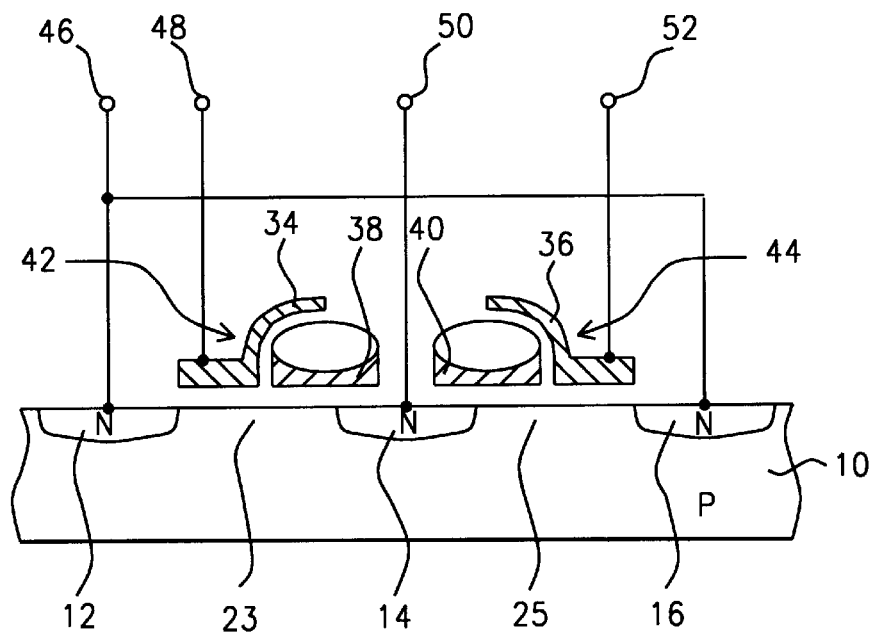
FIG. 4 shows a cross section view of two split gate flash memory cells in an array of split gate flash memory cells showing the electrical connections to the cell.
Figure 5:
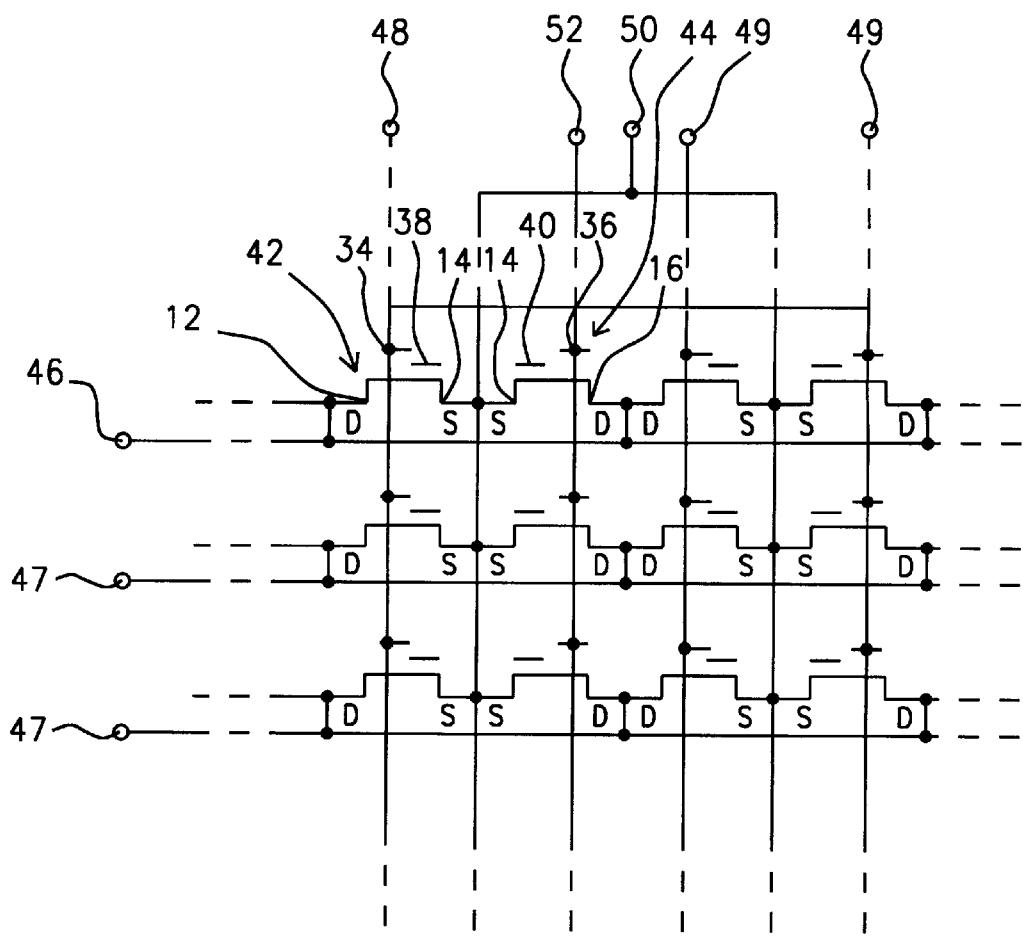
FIG. 5 shows a schematic view of a part of a memory array of split gate flash memory cells.

Refer now to FIGS. 3–5 for a description of the method for programming flash memory cells of this invention. FIG. 3 shows a cross section view of a part of a silicon substrate showing two flash memory cells formed therein, a first cell 42 and a second cell 44. The first cell 42 has a first drain 12, a first floating gate 38, a first control gate 34, and a first channel region 23. The second cell 44 has a second drain 16, a second floating gate 40, a second control gate 36, and a second channel region 25. The first cell 42 and the second cell 44 share a common source 14. A first length 18 of the first control gate 34 is directly over a part of the first channel region 23. A second length 20 of the second control gate 20 is directly over the second channel region 25.

In the first cell 42 there is an oxide or other dielectric formed in the space 22 between the first control gate 34 and the first channel region 23, in the space 24 between the first floating gate 38 and the first channel region 23, and in the space 27 between the first floating gate 38 and the first control gate 34. Likewise, in the second cell 44 there is an oxide or other dielectric formed in the space 28 between the second control gate 36 and the second channel region 25, in the space 26 between the second floating gate 40 and the second channel region 25, and in the space 29 between the second floating gate 40 and the second control gate 36. In the first floating gate 38 a first grown oxide region 30 is used to shape the first floating gate 38 so that the first floating gate 38 will have sharp points near the first control gate 34 to aid in erasing the first cell 42. Likewise, in the second floating gate 40 a second grown oxide region 32 is used to shape the second floating gate 40 so that the second floating gate 40 will have sharp points near the second control gate 36 to aid in erasing the second cell 44.

FIG. 3 shows an example of N channel flash memory cells. Those skilled in the art will recognize that FIG. 3 can also represent P channel cells by changing N regions to P regions and P regions to N regions. Methods of fabricating split gate flash memory cells are described in the U.S. patent application Ser. No. 09/298,142 (TSMC-98-258), filed on Apr. 23, 1999, entitled "SOURCE SIDE INJECTION PROGRAMMING AND TIP ERASING P-CHANNEL SPLIT GATE FLASH MEMORY CELL" which is incorporated herein by reference.

These flash memory cells are connected into an array having a first number of rows and a second number of columns. The drains of the cells in each of the rows of the array are electrically connected together and to a bit line, so there are said first number of bit lines. The control gates of the cells in each of the columns of the array are electrically connected together and to a word line, so there are said second number of word lines. The sources of all of the cells in the array are electrically connected together and to a common source node.

FIG. 4 shows schematically the electrical connections of the first cell 42 and the second cell when the first cell 42 and second cell 44 are in the same row connected to the same bit line. FIG. 4 shows the first drain 12 and the second drain 16 connected to the same bit line 46, the first control gate 34 connected to a word line 48, the second control gate 36 connected to another word line 52, and the source 14 for both the first cell 42 and the second cell 44 connected to a common source node 50. As shown in FIG. 4, the first floating gate 38 and second floating gate 40 are not electrically connected to other points of the circuit but remain electrically floating.

FIG. 5 shows a schematic view of three rows and four columns of a flash memory array having a first number of rows and a second number of columns. As shown in FIG. 5, the first cell 42 and the second cell 44 are in the same row and have their drains, 12 and 16, connected to the same bit line 46, the first control gate 34 connected to a word line 48, the second control gate 36 connected to a different word line 52, and the source 14 of both the first cell 42 and the second cell 44 connected to a common source node 50 along with the sources of all the other cells in the array. As shown in FIG. 5, the first floating gate 38 and second floating gate 40 remain electrically floating.

In order to program a selected cell, for example the first cell 42, of an array of N channel cells, voltages are applied which will cause hot electron tunnelling from the source of the selected cell to the floating gate of the selected cell while preventing hot electron tunnelling in non selected cells. Programming of the selected cell in an array of N channel cells is accomplished by supplying a large positive first voltage between the common source node 50 and ground potential; a smaller positive second voltage between the word line connected to the selected cell, in this example the word line with reference number 48, and ground potential; and a positive third voltage, smaller than the second voltage, between the bit line connected to the selected cell, in this example the bit line with reference number 46, and ground potential. In this example the first voltage is between about 7.6 and 11.4 volts, the second voltage is between about 1.6 and 2.4 volts, and the third voltage is between about 0.8 and 1.2 volts. These voltages will cause hot electron tunnelling from the source into the floating gate of the selected cell.

In order to prevent tunnelling in the non selected cells the positive first voltage is supplied between the remaining bit lines, in this example bit lines with reference number 47, and ground potential. A key part of this invention is that to prevent tunnelling in the non selected cells a negative fourth voltage is supplied between the remaining word lines, in this example word lines with reference numbers 49 and 52, and ground potential. In this example, this negative fourth voltage is between about −0.5 and −5.0 volts.

In order to program a selected cell, in this example the first cell 42, of an array of P channel cells, voltages are applied which will cause hot electron tunnelling from the floating gate of the selected cell to the source of the selected cell while preventing hot electron tunnelling in non selected cells. Programming of the selected cell in an array of P channel cells is accomplished by supplying a large negative first voltage between the common source node 50 of the array and ground potential; a smaller negative second voltage between the word line connected to the selected cell, in this example the word line with reference number 48, and ground potential; and a negative third voltage, less negative than the second voltage, between the bit line connected to the selected cell, in this example the bit line with reference number 46, and ground potential. In this example the first voltage is between about −7.6 and −11.4 volts, the second voltage is between about −1.6 and '12.4 volts, and the third voltage is between about −0.8 and −1.2 volts. These voltages will cause hot electron tunnelling from the floating gate into the source of the selected cell.

In order to prevent tunnelling in the non selected cells the negative first voltage is supplied between the remaining bit lines and ground potential, in this example bit lines with reference number 47. A key part of this invention is that to prevent tunnelling in the non selected cells a positive fourth voltage is supplied between the remaining word lines, in this example word lines with reference numbers 49 and 52, and ground potential. In this example, this positive fourth voltage is between about 0.5 and 5.0 volts.

In conventional methods of programming flash memory arrays the remaining, or non selected, word lines were connected to ground potential for both N channel and P channel cells, as is commonly done in stacked gate arrays. However, when the non selected word lines are grounded in split gate arrays the length of the control gate over the channel region, shown in FIG. 3 as reference number 18 in the first cell 42 and reference number 20 in the second cell, must have a relatively large minimum length in order to prevent unwanted tunnelling in non selected cells on the same bit line as the selected cell. With the negative fourth voltage for N channel cells and positive fourth voltage for P channel cells of this invention supplied to the non selected word lines this minimum length of control gate over the channel region can be smaller, between about 0.15 and 0.5 micrometers. This smaller minimum length allows the cell sizes and thus the array sizes to become smaller.

While the invention has been particularly shown and described with reference to the preferred embodiments thereof, it will be understood by those skilled in the art that various changes in form and details may be made without departing from the spirit and scope of the invention.

What is claimed is:

1. A method of programming N-channel split gate flash memory cells, comprising:

providing an array, said array having a first number of rows and a second number of columns, of N-channel split gate flash memory cells, wherein each of said cells has a floating gate, a channel region, an N type silicon source and an N type silicon drain;

providing a control gate for each of said flash memory cells, wherein a first length of each of said control gates is directly over a part of said channel region of the same cell;

providing said first number of bit lines;

providing said second number of word lines;

electrically connecting said drains of said second number of cells in each of said first number of rows to one of said bit lines;

electrically connecting said control gates of said first number of cells in each of said second number of columns to one of said word lines;

electrically connecting said sources in all of said cells in said array to a source supply node;

selecting one of said bit lines so there are one selected bit line and one less than said first number of non-selected bit lines;

selecting one of said word lines so there are one selected word line and one less than said second number of non-selected word lines;

providing a ground potential;

supplying a first voltage between said source supply node and ground potential, wherein said first voltage is positive;

supplying a second voltage between said selected word line and ground potential, wherein said second voltage is positive and less than said first voltage;

supplying a third voltage between said selected bit line and ground potential, wherein said third voltage is positive and less than said second voltage;

supplying a fourth voltage between each of said non-selected word lines and ground potential, wherein said fourth voltage is negative; and supplying said first voltage between each of said non-selected bit lines and ground potential.

2. The method of claim 1 wherein said first voltage is between about 7.6 and 11.4 volts.

3. The method of claim 1 wherein said second voltage is between about 1.6 and 2.4 volts.

4. The method of claim 1 wherein said third voltage is between about 0.8 a 1.2 volts.

5. The method of claim 1 wherein said fourth voltage is between about −0.5 and −5.0 volts.

6. The method of claim 1 wherein said first length is between about 0.15 and 0.5 micrometers.

7. A method of programming P-channel split gate flash memory cells, comprising:

providing an array, said array having a first number of rows and a second number of columns, of P-channel split gate flash memory cells, wherein each of said cells has a floating gate, a channel region, a P type silicon source and a P type silicon drain;

providing a control gate for each of said flash memory cells, wherein a first length of each of said control gates is directly over a part of said channel region of the same cell;

providing said first number of bit lines;

providing said second number of word lines;

electrically connecting said drains of said second number of cells in each of said first number of rows to one of said bit lines;

electrically connecting said control gates of said first number of cells in each of said second number of columns to one of said word lines;

electrically connecting said sources in all of said cells in said array to a source supply node;

selecting one of said bit lines so there are one selected bit line and one less than said first number of non-selected bit lines;

selecting one of said word lines so there are one selected word line and one less than said second number of non-selected word lines;

providing a ground potential;

supplying a first voltage between said source supply node and ground potential, wherein said first voltage is negative;

supplying a second voltage between said selected word line and ground potential, wherein said second voltage is negative and greater than said first voltage;

supplying a third voltage between said selected bit line and ground potential, wherein said third voltage is negative and greater than said second voltage;

supplying a fourth voltage between each of said non-selected word lines and ground potential, wherein said fourth voltage is positive; and supplying said first voltage between each of said non-selected bit lines and ground potential.

8. The method of claim 7 wherein said first voltage is between about −11.4 and −7.6 volts.

9. The method of claim 7 wherein said second voltage is between about −2.4 and −1.6 volts.

10. The method of claim 7 wherein said third voltage is between about −1.2 and −0.8 volts.

11. The method of claim 7 wherein said fourth voltage is between about 0.5 and 5.0 volts.

12. The method of claim 7 wherein said first length is between about 0.15 and 0.5 micrometers.

* * * * *